United States Patent [19]

Potthof et al.

[11] 4,455,587
[45] Jun. 19, 1984

[54] ELECTRONIC CONTROL CIRCUIT FOR THE FORMATION OF A MONOSTABLE SWITCHING BEHAVIOR IN A BISTABLE RELAY

[75] Inventors: Erwin Potthof, Rothenbach; Tilmann Kruger, Neunkerchen, both of Fed. Rep. of Germany

[73] Assignee: Diehl GmbH & Co., Fed. Rep. of Germany

[21] Appl. No.: 400,969

[22] Filed: Jul. 22, 1982

[30] Foreign Application Priority Data

Jul. 31, 1981 [DE] Fed. Rep. of Germany ....... 3130242

[51] Int. Cl.³ .......................................... H01H 47/00
[52] U.S. Cl. .................... 361/160; 361/196; 361/203; 307/132 E; 307/127; 307/598
[58] Field of Search .............. 361/160, 196, 203, 208; 307/127, 132 E, 592, 597, 598, 601

[56] References Cited

U.S. PATENT DOCUMENTS 4,260,912  4/1981  Bjorke .................................. 307/597
4,325,101  4/1982  Grundy ........................... 361/203 X

OTHER PUBLICATIONS das Datenblatt der SDS-Elektro GmbH.

*Primary Examiner*—Reinhard J. Eisenzopf
*Assistant Examiner*—Derek Jennings
*Attorney, Agent, or Firm*—Scully, Scott, Murphy & Presser

[57] ABSTRACT

An electronic control circuit for the formation of a monostable switching behavior in a bistable relay, including a logic circuit for the conversion of binary input signals into control signals for a switching circuit through which the direction of current flow is reversible within the relay, whereby the relay is switchable at each status change of the input signal. The electronic control circuit includes at least one time pulse generating circuit with an at least single-step divider circuit, wherein the input signal is applied to an interrogating circuit through which first control signals can be generated immediately after each status change of the input signal and in synchronism with a predetermined timing pulse, and in which the switching circuit consists of a bridge circuit controlled by the first control signals, through which the relay is supplied with short power pulses whose polarity can be reversed by the control signals.

7 Claims, 1 Drawing Figure

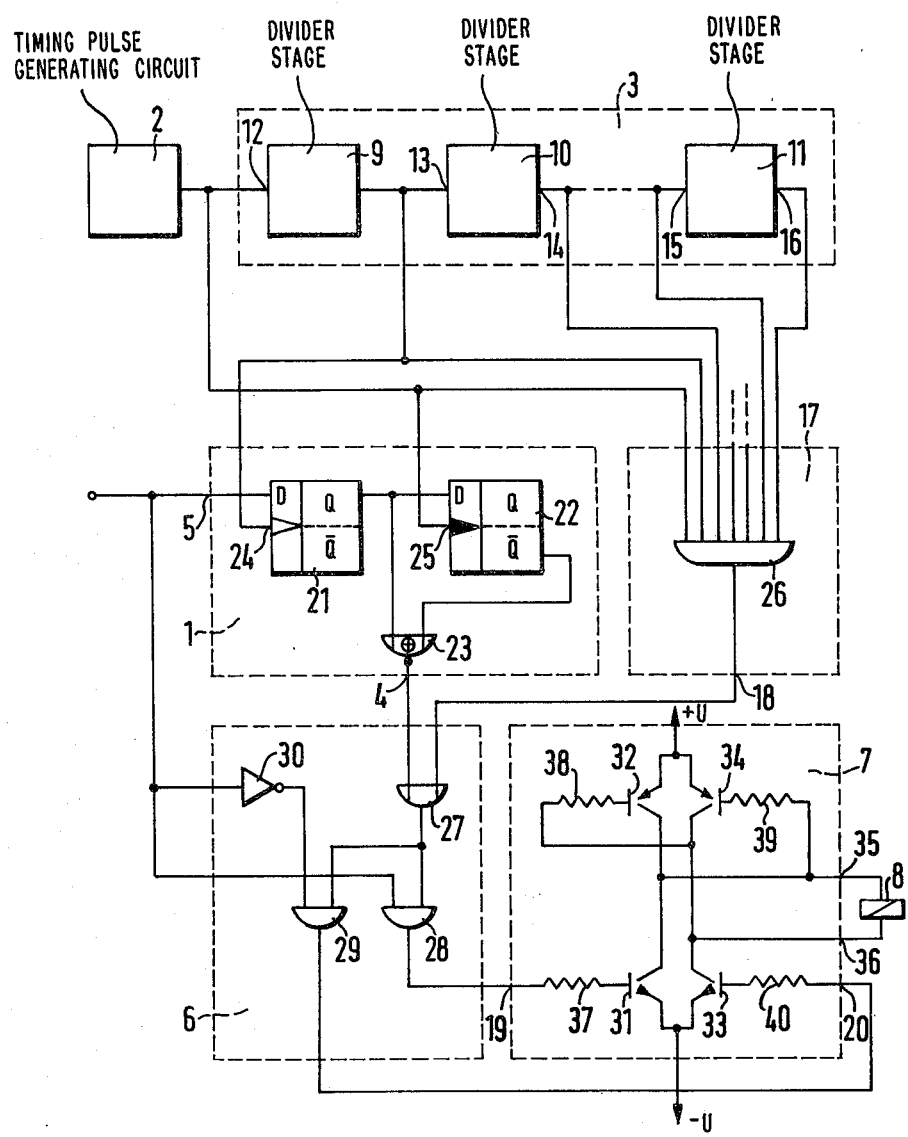

ns for the formation of a monostable switching behavior in a bistable relay

BACKGROUND OF THE INVENTION

1. Field of the Invention

The present invention relates to an electronic control circuit for the formation of a monostable switching behavior in a bistable relay, including a logic circuit for the conversion of binary input signals into control signals for a switching circuit through which the direction of current flow is reversible within the relay, whereby the relay is switchable at each status change of the input signal.

2. Discussion of the Prior Art

Control circuits of that type are presently known in the technology. Thus, for example, ascertainable from the data sheet of the SDS-Electro GMBH, pertaining to its module IC-12V, or IC-24V, is an electronic control circuit for a bistable relay by means of which there is produced a monostable switching behavior. Thereby, a bistable relay is connected in series with a condenser, wherein the condenser must be so dimensioned that the capacitance of the condenser produces a charging time constant in conjunction with the coil resistance of the relay which is at least as large as the response time of the relay. Obtained thereby, particularly in the control of relays with high switch rating pursuant to the second page of the data sheet, are capacitance values of up to a few hundred microfarads, which considerably increases the necessary volume for the control circuit.

The function of the control circuit is such that subsequent to the application of the control voltage, which must here be identical with the power supply for the relay is charged at one of the two control inputs of the above-mentioned condenser, and the relay is switched over with the charging current. When the control voltage drops out, then the condenser is discharged through a flip-flop which incorporates a transistor T5 as a power branch, and the relay is switched back into the initial condition by means of the discharge current of the condenser. This signifies that the relay will be switched over at each status change in the control voltage into the respective condition. When the condition of the relay is thus changed without any change in the status of the input voltage, due to disturbances, for example, of a mechanical type, then this is neither determined by the control circuit, nor is it corrected.

As has already been indicated hereinabove, the control voltage for the control circuit must concurrently supply the relay with power; in essence, any control of that type of control circuit with a usual logic transmission level is not possible, but a suitable power interface must be connected ahead thereof.

Furthermore, in the present circuit there is no provision to connect the relay in synchronism with a predetermined timing pulse, which is of particular advantage in the switching of alternating currents of high power (for example, switching during zero passage of the current cycle.)

SUMMARY OF THE INVENTION

Accordingly, it is an object of the present invention to provide an electronic control circuit of the above-mentioned construction which can be fully integrated so that, besides the relay, no further external components are required. Furthermore, the actuation of the control circuit should be possible with the usual logic, transmission levels, for example, essentially directly directly through a microcomputer.

A further object of the invention resides in that in a control circuit of that type there can be avoided that the relay will remain in an erroneous switched condition beyond a predetermined maximum time interval.

In order to achieve the foregoing objects, an electronic control circuit of the type set forth hereinabove includes at least one time pulse generating circuit with an at least single-step divider circuit, wherein the input signal is applied to an interrogating circuit through which first control signals can be generated immediately after each status change of the input signal and in synchronism with a predetermined timing pulse, and in which the switching circuit consists of a bridge circuit controlled by the first control signals, through which the relay is supplied with short power pulses whose polarity can be reversed by the control signals.

A control circuit of that type can be fully integrated in a simple manner through the elimination of the condenser. Upon the selection of a suitable timing pulse frequency, the relay is presently switched over within an extremely short period subsequent to a status change of the input signal, while independently thereof, there can be generated regenerating pulses for the relay at predetermined intervals, through which the relay, as required, is switched over into the correct position. The intervals between these regenerating pulses can be so correlated with the current purpose of use, that any erroneous function can be maximally of only such a duration which would not be detrimental to the applicable arrangement. Through the separation of the current supply for the relay by means of the bridge circuit there is achieved that the control circuit can be actuated with the usual logic transmission levels without difficulties; for example, a direct connection with a microcomputer is essentially possible.

In a preferred embodiment of the electronic control circuit, one divider stage, preferably the first divider stage, should evidence an odd-numbered dividing ratio. Thus, when the timing pulse generating circuit is synchronized with the frequency of a supply voltage, with this supply voltage to be be connected through the relay, then by means of this measure there is obtained the particular advantage that the relay will statistically switch over during the positive and negative halfwave of the voltage which is to be connected, in essence, through this measure there is avoided the wandering of the contact material of the relay occuring especially during the switching in at high power.

Furthermore, the timing pulse generating circuit can be so synchronized with the frequency of a current which is to be connected in, that the time point of the switching sequence of the current curve.

BRIEF DESCRIPTION OF THE DRAWING

Reference may now be had to the following detailed description of a preferred embodiment of the invention, taken in conjunction with the accompanying drawing in which the single FIGURE illustrates a basic circuit block diagram of the electronic control circuit.

DETAILED DESCRIPTION

The electronic control circuit as illustrated in the drawing consists of an interrogating circuit 1 which is supplied with at least two differing timing pulse signals from a timing pulse generating circuit 2 having at least one divider circuit 3 of at least a single-stage which is connected to the output thereof. The timing pulse generating circuit 2 can operate either freely oscillating or externally synchronized. The interrogating circuit 1 has an output 4 and an input 5 connected with the inputs of a logic circuit 6 which, in turn, again so actuates a switching circuit 7, so that a bistable relay 8 is supplied with power pulses of alternating polarity.

In a preferred embodiment, the divider circuit 2, as is illustrated in the drawing, includes a plurality of divider stages 9, 10, 11, whose inputs and, respectively, outputs 12, 13, 14, 15, 16 are connected with a regenerating circuit 17, whose output 18 also activates an input of the logic circuit 6.

Thereby, the inventive electronic control circuit should control the bistable relay 8 so as to produce a monostable switching behavior. This is attained in that through the intermediary of the interrogating circuit 1 there is modulated a binary input signal which is present at the input 5 thereof, at a determinate, preset timing pulse frequency. When the status of the input signal changes, then the interrogating circuit 1 generates at its output 4 a short, first control signal which is in synchronism with the preset timing pulse. This first control signal is transmitted to the logic circuit 6 which, moreover, is connected with the input 5 of the interrogating circuit 1, and will thus also be controlled with the input signal. The logic circuit 6, in correspondence with the status of the input signal to one of the two inputs 19, 20 of the switching circuit 7, whereupon the bistable relay 8 is supplied with a power pulse. The polarity of the power pulse is thereby dependent upon which of the two inputs 19, 20 is activated; the duration of the power pulse is equal to that of the first control pulse.

Through the variation of the timing pulse frequency which is generated by the timing pulse generating circuit 2, for instance through variation of the pulse-pause relationship of this timing pulse, it is then possible to so correlate the length of the power pulses for the relay 8 to its response sensitivity, such that the current consumption for the switching over the bistable relay 8 is adjustable to a minimum value.

In the already above-mentioned preferred embodiment of the electronic control circuit with an additional regenerating circuit 17, additional control signals are generated at the output 18 of the regenerating circuit 17, whose series frequency corresponds to the frequency generated by the final divider stage 11, whereas the pulse duration of these additional control signals corresponds to the pulse interval of the timing pulses generated by the timing pulse generating circuit 2. These additional control signals are transmitted to the logic circuit 6, which are treated therein in the same manner as with the first control signals; in essence, the further control signals are transmitted to one of the two inputs 19, 20 of the switching circuit 7 in dependence upon the status of the input signal, so that the bistable relay 8 is supplied with additional power pulses of corresponding polarity. These additional control signals from the regenerating circuit 17 should prevent the bistable relay 8 from remaining, when the latter is switched into an erroneous position, for example, through disruptions or through mechanical defects, beyond a predetermined time period in this erroneous switching position. Through a suitable selection of the frequency of the additional control signals from the regenerating circuit 17 there can thus be dependably prevented that the relay will remain in an incorrect switching position beyond a maximum permissible time period.

Since the pulse duration of the first control signals from the interrogating circuit 1, as well as the pulse duration of the additional control signals from the regenerating circuit 17 are dependent upon the timing pulse frequency generated by the timing pulse generating circuit, in essence, upon the timing pulse duration, for optimizing the duration of the power pulses with respect to the current consumption at the additional control signals, the same is effective as is for the first control signals.

The interrogating circuit 1, for example, as is illustrated in the drawing figure consists of two D flip-flops 21, 22 which are connected in series, as well as an exclusive NOR-gate 23. The first D flip-flop 21 evidences a positive curve slope-triggered timing pulse input 24. The D input of the first flip-flop 24 forms the input 5 of the interrogating circuit 1. The non-inverted output Q of the first flip-flop 21 is connected with the D-input of the second flip-flop 22, as well as with an input of the exclusive NOR-gate 23. The second D flip-flop 22 evidences a negative curve slope-triggered timing pulse input 25. The inverted output $\overline{Q}$ of the second flip-flop 22 is similarly connected with an input of the exclusive NOR-gate 23. The output of the same exclusive NOR-gate forms the output 4 of the interrogating circuit 1.

The two pulse inputs 25, 24 of the D flip-flops 21, 22 are supplied with different timing pulse frequencies. The second D flip-flop 22 obtains its timing pulse, in the illustrated embodiment, directly from the timing pulse generating circuit 2; the first flip-flop 21 obtains its timing pulse from the first divider stage 9 out of the divider circuit 3; meaning, that the timing pulse for the first D flip-flop 21 is lower-frequencied than that for the second D flip-flop 22. At a change in the status of the input signal which is present at the input 5 of the interrogating circuit 1, this status will appear with the subsequent rising curve slope of the lower-frequencied timing pulse at the output Q of the D flip-flop 21; in essence, the interrogating circuit 1 keys the input signal with the frequency of the lower-frequencied timing pulse from the first divider stage 9. The signal which appears at the output Q of the first flip-flop 21 is transmitted further along with the subsequent downward curve slope of the higher-frequencied timing pulse at the output of the second D flip-flop 22. the non-inverted output signal of the first D flip-flop 21 and the inverted output signal of the second D flip-flop 22 are combined in the exclusive NOR-gate 23. At the output of the exclusive NOR-gate 23 there is thus produced a pulse which begins with the rising curve slope of the lower-frequencied timing pulse and ends with the subsequent downward slope of the higher-frequencied pulse; in essence, this pulse has exactly the same pulse duration as a timing pulse of the higher-frequencied timing pulse from the timing pulse generating circuit 2. The output of the exclusive NOR-gate 23 is identical with the output 4 of the interrogating circuit 1; in essence, the output signal of the exclusive NOR-gate 23 corresponds to the first control signal which is transmitted to the logic circuit 6.

The regenerating circuit 17 can, for example, consist of a multiple AND-gate 26, wherein the inputs of the AND-gate 26 are presently connected with the inputs or, respectively, outputs 12, 13, 14, 15, 16 of the individual divider stages 9, 10, 11. The regenerating circuit 17 should produce additional control signals at its output 18, which appear at a frequency which corresponds to the timing pulse frequency produced by the last divider stage 11. The timing pulse duration of these additional control signals should, in contrast, correspond to the timing pulse duration of the timing pulses generated by the timing pulse generating circuit 2. The additional control signals at the output 18 of the regenerating circuit 17, in the illustrated embodiment, are produced completely independently of the first control signals, which can be taken off at the output 4 of the interrogating circuit 1. However, within the scope of the invention it is also possible to obtain a resetting pulse from the first control signals, by means of which the divider circuit 3 is reset into the initial condition, so that the first additional control signal subsequent to the status change of the input signal will always appear later. Through this measure, especially when the relay 8 is frequently switched over, there is reduced the number of additional control signals and, as a result, the energy consumption. Through the selection of an overall dividing relationship for the divider circuit 3, there is thus determined the series frequency of the additional control signals so that, as previously described, there can be carried out a purposeful correlation to the present conditions.

The first and the additional control signals are transmitted to the logic circuit 6 which combines these two control signals by means of an OR-gate 27. This OR-gate 27 is only necessary when, in the preferred embodiment of the control circuit, there is provided the regenerating circuit 17. When the regenerating circuit 17 is eliminated, there can also be eliminated the OR-gate 27. Furthermore, the logic circuit 6 of two AND-gates 28, 29, of which one input of each is supplied with the combined control signals from the OR-gate 27. The other respective input is connected directly, in effect across an inverter 30, with the input 5 of the interrogating circuit 1. The outputs of the AND-gates 28, 29 each control respectively one input 19, 20 of the switching circuit 7. The function of the logic circuit 6 is thereby such that the combined first and additional control signals, dependent upon the status of the input signal at the input 5 of the interrogating circuit 1, are presently transmitted to one of the inputs 19, 20 of the switching circuit 7.

The switching circuit 7 consists of a bridge circuit for supplying the relay 8 with power pulses of alternating polarity. The bridge circuit is assembled from two branches of presently two complementary transistors 31, 32, 33, 34, wherein the emitters of the presently not complementary transistors 31, 33, and 32, 34 are presently connected with each other and with the poles +U, −U of a voltage source. The collectors of the presently complementary transistors 31, 32 and 33, 34 are similarly connected with each other and concurrently represent the outputs 35, 36 of the switching circuit 7. The bases of presently the two other not complementary transistors 31, 33 from the inputs 19, 20 of the switching circuit 7. The bases of the two other not complementary transistors 32, 34 are presently connected with one of the outputs 35, 36, and essentially in such a manner, that the bases of the transistors 32, 34 of the one branch are presently connected with the collector of the other branch. Preferably, connected ahead of the bases of the transistors 31, 32, 33, 34 are current-limiting resistors 37, 38, 39, 40.

Within the scope of the invention it is also possible to employ other bridge circuits for the switching circuit 7; for example, two parallel-connected inverters used in the CMOS technology. It is decisive for the applicability of those types of bridge circuits that they apply for the duration of the control signal of the relay present at the inputs 19, 20 on the poles +U, −U of the current supply, wherein the current flow direction through the relay 8 is dependent upon which of the two inputs 19, 20 of the switching circuit is actuated.

When the timing pulse generating circuit 2, in a preferred embodiment of the electronic control circuit, is synchronized in a suitable manner with the frequency of a current supply which is to be connected through the relay 8, then the first control signal presently occurs, and therewith also the power pulse for the relay 8, at or almost at the zero passage of the current curve of the current supply, so as to reduce the contact consumption in the relay 8.

In a further preferred embodiment, selected for the first divider stage of 9, additional to the previously mentioned measure, is an odd-numbered dividing ratio, for example, a dividing ratio of 3, so that a power pulse for the relay 8 can be produced only at each third timing pulse from the timing pulse generating circuit 2. This signifies that the relay 8 will switch over only at each third (or, in essence, a multiple thereof) halfwave of the current curve of the current supply, so that the switching sequence will statistically take place during a positive and a negative halfwave. Through this measure there is prevented the shifting of the contact material of the relay 8, such as can occur with direct-current operation.

What is claimed is:

1. In an electronic control circuit for the formation of a monostable switching behavior in a bistable relay, including a logic circuit for the conversion of binary input signals into control signals for a switching circuit, through which the direction of current flow is reversible within the relay, said relay being switchable at each status change of the input signal; the improvement comprising a timing pulse generating circuit including an at least single-stage divider circuit; and interrogating circuit for receiving said input signal so as to generate first control signals immediately after each status change of the input signal and in synchronism with a predetermined timing pulse, said switching circuit including a bridge circuit controlled by said first control signals for supplying said relay with short power pulses whose polarity is reversible through said control signals.

2. Electronic control circuit as claimed in claim 1, comprising a regenerating circuit for generating additional control signals at greater time intervals, said additional control signals being dependent upon the status of the input signal in the same manner as the first control signals.

3. Electronic control circuit as claimed in claim 2, comprising a disjunctive interconnection combining the first control signals from the interrogating circuit and the additional control signals from the regenerating circuit, the output signal of the disjunctive interconnection being combined through a conjunctive interconnection with the input signal, respectively inverted input signal, said bridge circuit being controllable through the outputs of the conjunctive interconnection.

4. Electronic control circuit as claimed in claim 1, said bridge circuit comprising two branches having complementary transistors, the base of one transistor in each said branch forming a control input of the bridge circuit, the base of the other transistor being connected with an output of the other branch.

5. Electronic control circuit as claimed in claim 1, said timing pulse generating circuit being synchronized with an external frequency, such as the power supply frequency, and including at least one divider stage having an odd-numbered dividing ratio.

6. Electronic control circuit as claimed in claim 5, said divider stage having the odd-numbered dividing ratio being the first divider stage following the timing pulse generating circuit.

7. Electronic control circuit as claimed in claim 1, wherein the pulse-pause relationship of the timing pulse generated by the timing pulse generating circuit is adjustable so that the power pulse supplying said relay is correlatable with the power demand of the relays.

* * * * *